United States Patent
Mitsui

[19]

[11] Patent Number: 6,037,083

[45] Date of Patent: Mar. 14, 2000

[54] HALFTONE PHASE SHIFT MASK BLANKS, HALFTONE PHASE SHIFT MASKS, AND FINE PATTERN FORMING METHOD

[75] Inventor: Masaru Mitsui, Tokyo, Japan

[73] Assignee: Hoya Corporation, Tokyo, Japan

[21] Appl. No.: 09/217,838

[22] Filed: Dec. 22, 1998

[51] Int. Cl.[7] .................................................. G03F 9/00
[52] U.S. Cl. ............................................................ 430/5
[58] Field of Search ................................ 430/5, 322, 324; 216/72; 378/35

[56] References Cited

U.S. PATENT DOCUMENTS 4,696,877  9/1987  Matsui et al. ................................ 430/5
5,272,024  12/1993  Lin ................................................ 430/5

FOREIGN PATENT DOCUMENTS 6-332152  12/1994  Japan .
8-101493  4/1996  Japan .

*Primary Examiner*—S. Rosasco
*Attorney, Agent, or Firm*—Oliff & Berridge, PLC

[57] ABSTRACT

An object is to provide acid-resistant, highly reliable phase shift masks, and phase shift mask blanks, wherewith high-precision patterning is possible.

A halftone phase shift mask blank comprising a transparent substrate 10, a halftone material film 11 laminated on that transparent substrate, and a metal film 12 laminated on that halftone material film, wherein the metal film is formed by a plurality of metal films having different etching rates, and the etching rate for the metal film positioned on the transparent substrate side is set so that it is faster, either in stages or continuously, than the etching rate of the metal film positioned on the surface side.

18 Claims, 11 Drawing Sheets

Halftone material film (MoSi based)

| | COMPARATIVE EXAMPLE 2 | EMBODIMENT 2 | EMBODIMENT 3 | EMBODIMENT 4 | EMBODIMENT 5 | EMBODIMENT 6 | EMBODIMENT 7 | COMPARATIVE EXAMPLE 3 |
|---|---|---|---|---|---|---|---|---|
| N CONTENT IN CrN (AT%) | 3 | 5 | 10 | 30 | 40 | 50 | 60 | 65 |
| CrN ETCHING RATE (nm/sec) | 1.3 | 1.6 | 1.9 | 2.5 | 2.7 | 2.8 | 2.9 | 3.0 |
| DIFFERENCE BETWEEN CrN AND CrC ETCHING RATE (nm/sec) | 1.0 | 1.3 | 1.6 | 2.2 | 2.4 | 2.5 | 2.7 | 3.0 |
| UNDERCUT ($\mu$) | <0.01 | 0.01 | 0.02 | 0.03 | 0.05 | 0.07 | 0.1 | 0.2 |
| PHASESHIFT (°) | 175 | 178 | 179 | 180 | 180 | 180 | 180 | 180 |

FIG.6

HALFTONE PHASE SHIFT MASK BLANKS, HALFTONE PHASE SHIFT MASKS, AND FINE PATTERN FORMING METHOD

BACKGROUND OF THE INVENTION

1. Field of the Invention

This invention relates to phase shift masks, and to phase shift mask blanks as base materials therefor, wherewith the resolution of the transfer pattern can be enhanced by imparting a phase difference between the exposure light beams passing through the masks, and more particularly relates to so-called halftone phase shift masks and halftone phase shift mask blanks.

2. Description of the Related Art

In the manufacture of semiconductor LSIs, photo-masks are used as masks during fine pattern exposure. One type of such a photo-mask that is used is a phase shift mask made so that, by imparting phase differences between the exposure light passing through the mask, the resolution of the transfer pattern can be enhanced.

In recent years, the halftone phase shift mask has been developed as one type of such a phase shift mask, and has come into use.

One such halftone phase shift mask that is known in the prior art is the halftone phase shift mask disclosed in Unexamined Patent Application No. H6-332152/1994, in gazette, which is particularly well suited to the transfer of patterns wherein single holes, dots, and lines are independent.

The halftone phase shift mask disclosed in the cited application configures a mask pattern formed on a transparent substrate with a light transmitting portion that transmits light of an intensity that contributes substantially to exposure and a light translucent portion that transmits light of an intensity that does not contribute substantially to exposure. The phase of the light passing through the light translucent portion is shifted, so that the phase of the light passing through the light translucent portion bears a relationship respecting the phase of the light passing through the light transmitting portion that is substantially inverted, whereby the light passing in the vicinity of the boundary between the light transmitting portion and the translucent portion cancel each other out, thus making it possible to secure good contrast at the boundary.

In such a halftone phase shift mask as this, the light translucent portion has two functions, namely a light blocking function for substantially blocking the exposure light and a phase shifting function for shifting the phase of the light. Thus it is not necessary to form a light blocking film pattern and a phase shift film pattern separately, wherefore the structure is simple and fabrication is simple.

One known conventional example of a halftone phase mask blank for use as the material in such a halftone phase mask is diagrammed in FIG. 11 and 12.

The halftone phase mask blank diagrammed in FIG. 11(a) has a molybdenum silicon (MoSi)-based halftone material film 2, for example, formed on a transparent substrate 1. The halftone phase mask blank diagrammed in FIG. 12(a) has a molybdenum silicon-based halftone material film 2 formed on a transparent substrate 1, but also has, on top of that halftone material film 2, a molybdenum metal film 3 for the purpose of preventing the transparent substrate 1 from being charged during electron beam exposure so that the path of electron beam advance becomes unstable.

In order to make halftone phase masks from these halftone phase mask blanks, as indicated in FIG. 11(b) and FIG. 12(b), a resist film 4 is first formed on the respective halftone material films 2. Then, after subjecting this resist film 4 to electron beam exposure and developing, the desired resist patterns 5 are formed, as indicated in FIG. 11(c) and FIG. 12(c). However, when the molydenum metal film 3 and/or the halftone material film 2 is etched using this resist pattern 5 as the mask, the resist pattern 5 itself gets etched, beginning from its edges. Therefore the dimensions of the halftone material film 2 cannot be controlled accurately, as a result of which it is not possible to etch the halftone material film 2 with high precision, which is a problem.

Furthermore, in the process steps from film formation to the point where the halftone phase shift mask is finished, various chemicals such as acids and bases are sometimes used. Thus a problem arises when, due to the use of such chemicals, the properties of the halftone material film 2 are changed, and the desired halftone properties are not obtained.

In order to resolve such problems as these, a halftone phase shift mask blank is proposed in Unexamined Patent Application H8-101493/1996, in gazette, wherein a metal film 6 that enables the selective etching of the halftone material film 2 is formed on that halftone material film 2, as diagrammed in FIG. 13(a).

This halftone phase shift mask blank is configured with a MoSiOxNy (where x×y=an integer) halftone material film 2 formed on the transparent substrate 1, and a Cr metal film 6 laminated on the halftone material film 2.

By configuring the phase shift mask blank in this way, the Cr metal film 6 and MoSiOxNy halftone material film 2 can be etched independently, making it possible to subject the halftone material film 2 to various desirable treatments, and thus making it possible to pattern the halftone material film 2 with high precision.

In the halftone phase shift blank diagrammed in FIG. 13(a), however, when the halftone phase shift mask is being fabricated, a resist film 7 is formed on the metal film 6, the resist film 7 is subjected to electron beam exposure, as diagrammed in FIG. 13(b), and is then developed, forming the desired resist pattern 8 diagrammed in FIG. 13(c). When the metal film 6 or the metal film 6 and the halftone material film 2 are etched, using this resist pattern 8 as a mask, the metal in the metal film 6 remains on the halftone material film 2, whereupon the halftone material film 2 is patterned with that fine metal acting as a mask, resulting in flaws developing in the pattern, which is a problem.

Also, when the Cr metal film capable of selecting etching is formed on the MoSiOxNy halftone material film 2 and this Cr metal film 6 is patterned by wet etching, the Cr metal film 6 etching rate is slow. While it cannot be said that this has absolutely no effect on the MoSiOxNy halftone material film 2, it does have considerable effect on the optical characteristics.

Furthermore, the bonding strength between the halftone material film 2 and Cr metal film 6 is inadequate, leading to a problem of film peeling.

SUMMARY OF THE INVENTION

The present invention has been fashioned in view of the problems with the prior art set forth above. An object of the present invention is to provide halftone phase shift masks and halftone phase shift mask blanks that exhibit high acid resistance and high reliability, and wherewith high precision patterning is possible.

In order to resolve the problems stated in the foregoing, a first invention is a halftone phase shift mask blank comprising: a transparent substrate; a halftone material film laminated on that transparent substrate; and a metal film laminated on that halftone material film; wherein: the metal film is configured with materials having differing etching rates, as the etching proceeds from the surface side toward the transparent substrate side, either in stages, or continuously, or partly in stages and partly continuously, with that etching rate set so that it becomes faster, as the transparent substrate side is approached from the surface side, either in stages, or continuously, or partly in stages and partly continuously.

A second invention is the halftone phase shift mask blank according to the first invention, wherein the metal film is employed as a mask when forming a pattern on the halftone material film by photolithography.

A third invention is the halftone phase shift mask blank according to the second invention, wherein the metal film comprises materials having etching characteristics different from those of the halftone material film.

A fourth invention is the halftone phase shift mask blank according to the third invention, wherein the metal film comprises materials having a faster etching rate than the halftone material film.

A fifth invention is the halftone phase shift mask blank according to the second invention, wherein the metal film comprises materials exhibiting a light-blocking function.

A sixth invention is the halftone phase shift mask blank according to the fifth invention, wherein the halftone material film has molybdenum and silicon as its main constituent elements, and the metal film has chromium as its main constituent element.

A seventh invention is the halftone phase shift mask blank according to the first invention, wherein: the metal film comprises a plurality of components that includes one or more components in addition to the metal constituting the main component; a component other than the metal among the plurality of components either is a component that speeds up the etching rate of the metal film, as compared to the etching rate of a film comprising only the metal, or is a component that slows down that rate, or is a plurality of components that includes a component that speeds up that rate and a component that slows down that rate; the component speeding up the etching rate is contained in the metal film so that a region exists wherein the amount of that component contained increases continuously as the transparent substrate side is approached from the surface side of the metal film; and the component slowing down the etching rate is contained in the metal film so that a region exists wherein the amount of that component contained decreases continuously as the transparent substrate side is approached from the surface side of the metal film.

An eighth invention is the halftone phase shift mask blank according to the seventh invention, wherein: the component speeding up the etching rate is a component containing nitrogen, and the component slowing down the etching rate is a component containing carbon.

A ninth invention is a halftone phase shift mask blank comprising: a transparent substrate; a halftone material film laminated on that transparent substrate; and a metal film laminated on that halftone material film; wherein: the halftone material film consists of material containing a metal and silicon; the metal film consists of material the main component of which is chromium; a component containing nitrogen is contained in the region closer to the transparent substrate side of the metal film; and a component containing carbon is contained in the region closer to the surface side of the metal film.

A tenth invention is the halftone phase shift mask blank according to the ninth invention, wherein the nitrogen composition ratio in the region containing the component containing nitrogen closer to the transparent substrate side of the metal film is 5 to 60 at %.

An 11th invention is the halftone phase shift mask blank according to the ninth invention, wherein the carbon composition ratio in the region containing the component containing carbon closer to the surface side of the metal film is 4 to 18 at %.

A 12th invention is the halftone phase shift mask blank according to the ninth invention, wherein the metal film has either a region wherein the nitrogen content continuously increases, or a region wherein the carbon content continually decreases, as the transparent substrate side is approached from the surface side of the metal film, or a region wherein the nitrogen content continuously increases while the carbon content continuously decreases as the transparent substrate side is approached from the surface side of the metal film.

A 13th invention is the halftone phase shift mask blank according to the first invention, wherein an anti-reflection film is provided on the metal film.

A 14th invention is the halftone phase shift mask blank according to the 13th invention wherein the anti-reflection film contains the metal configuring the metal film and at least oxygen.

A 15th invention is the halftone phase shift mask blank according to the 14th invention wherein the metal film and the anti-reflection film are formed integrally as a layer that is continuous in the thickness direction.

A 16th invention is a halftone phase shift mask containing-a halftone material film in which is formed a mask pattern wherein: the mask pattern formed in the halftone material film is formed by performing mask pattern formation processing on the metal film and the halftone material film of the halftone phase shift mask blank cited in claim 1.

A 17th invention is the halftone phase shift mask according to claim 16, wherein the metal film cited in claim 1 is formed either in a region that is on the halftone material film in a region other than a region in which a mask pattern is formed, or in a region in which a mask pattern is formed.

An 18th invention is a fine pattern forming method for forming fine patterns by a photolithographic method, wherein: the halftone phase shift mask cited in claim 16 is employed as the mask when transferring the fine pattern.

How the invention works is now described.

As based on the first invention described in the foregoing, by making the metal film formed on the halftone material film a film wherein the etching rate is faster, either in stages or continuously, as the transparent substrate is approached from the metal film surface side, damage to the halftone material film due to excessive over-etching can be prevented, while also preventing residual metal from the metal film on the halftone material film.

Thus it is possible to control the halftone phase shift amount with high precision, and obtain halftone phase shift mask blanks wherewith halftone phase shift masks can be obtained which are free of pattern flaws.

The metal described above, moreover, as in the second invention, exhibits a mask function when subjecting the halftone material film to pattern formation with a photolithographic method.

More specifically, as in the third invention, the metal film consists of material having etching characteristics different from those of the halftone material film. By using a material having different etching characteristics, and by selecting the etching and the specific materials for the metal film and the halftone material film, for example, when patterning the metal film by wet etching or dry etching, the halftone material film can be made such that it is not readily patterned by the wet etching or dry etching.

Furthermore, as in the fourth invention, by configuring the metal film with material exhibiting a higher etching rate than the halftone material film, it is possible to further enhance both the effect of preventing damage to the halftone material film by excessive over-etching and the effect of preventing residual metal from the metal film on the halftone material film.

It is preferable that the metal film be such that the etching rate at the metal film in contact with the halftone material film be 2 nm/sec or higher.

When the etching rate is lower than 2 nm/sec, the etching rate is slow, wherefore, depending on the metal film material, over-etching affects the halftone material film when metal in the metal film remaining on the halftone material film is completely eliminated, which is undesirable.

In the case of a single-layer halftone phase shift mask blank, the halftone material film may be made such that its main components are a metal, silicon, and oxygen and/or nitrogen. Examples of such which may be cited include oxidized molybdenum and silicon (hereinafter called MoSiO-based materials), nitrogenized molybdenum and silicon (hereinafter called MoSiN-based materials), oxidized and nitrogenized molybdenum and silicon (hereinafter called MoSiON-based materials), oxidized tantalum and silicon (hereinafter called TaSiO-based materials), nitrogenized tantalum and silicon (hereinafter called TaSiN-based materials), oxidized and nitrogenized tantalum and silicon (hereinafter called TaSiON-based materials), oxidized tungsten and silicon (hereinafter called WSiO-based materials), nitrogenized tungsten and silicon (hereinafter called WSiN-based materials), oxidized and nitrogenized tungsten and silicon (hereinafter called WSiON-based materials), oxidized titanium and silicon (hereinafter called TiSiO-based materials), nitrogenized titanium and silicon (hereinafter called TiSiN-based materials), oxidized and nitrogenized titanium and silicon (hereinafter called TiSiON-based materials), oxidized chromium and silicon (hereinafter called CrSiO-based materials), nitrogenized chromium and silicon (hereinafter called CrSiN-based materials), oxidized and nitrogenized chromium and silicon (hereinafter called CrSiON-based materials), and fluoridated chromium and silicon (hereinafter called CrSiF-based materials). These materials, furthermore, may contain minute quantities or suitable quantities of carbon, hydrogen, fluorine, or helium, etc., in the form of compounds therewith or mixtures therewith, within such range as the functions of the halftone material film are not impaired.

In the present invention, moreover, it is possible to use, as the materials which constitute the halftone material film, oxides of molybdenum silicide, nitrides of molybdenum silicide, oxide-nitrides of molybdenum silicide, oxides of tantalum silicide, nitrides of tantalum silicide, oxide-nitrides of tantalum silicide, oxides of tungsten silicide, nitrides of tungsten silicide, oxide-nitrides of tungsten siticide, oxides of titanium suicide, nitrides of titanium silicide, or oxide-nitrides of titanium silicide, or substances which are mixtures of one or more of these substances and silicon nitride and/or a metal nitride.

It is also possible to use, as the materials which constitute the halftone material film, such substances as oxidized molybdenum silicide (MoSiO), nitrogenized molybdenum silicide (MoSiN), oxidized and nitrogenized molybdenum suicide (MoSiON), oxidized tantalum silicide (TaSiO), nitrogenized tantalum silicide (TaSiN), oxidized and nitrogenized tantalum silicide (TaSiON), oxidized tungsten silicide (WSiO), nitrogenized tungsten silicide (WSiN), oxidized and nitrogenized tungsten silicide (WSiON), oxidized titanium suicide (TiSiO), nitrogenized titanium silicide (TiSiN), or oxidized and nitrogenized titanium silicide (TiSiON).

As preferable halftone material films for use in the single layer halftone phase shift mask blanks, it is desirable that substances be used which have a metal silicon, and nitrogen as their main constituent elements, such as nitrogenized molybdenum and silicon (MoSiN based), excelling in terms of acid resistance, light resistance, electrical conductivity, refractive index, transmissivity, and etching selectivity, for example. When the bonding characteristics with the metal film containing nitrogen formed on the halftone material film, described below, are considered, together with other compatibility factors, MoSiN-based materials are preferable for the halftone material film.

In the foregoing, a single-layer structure is assumed for the halftone material film in the halftone phase shift mask blank, but there is no absolute necessity that the halftone material film be a single layer. It may instead be a film structure having two or more layers, with one layer, for example, being a high-transmissivity film having primarily a phase shifting function, and another layer being a low-transmissivity film having primarily a light-blocking function. In that case, for the high-transmissivity film, an SOG (spin on glass) film may be used wherein an $SiO_2$ coating film forming coating liquid is dripped on and spread over the entire surface by spin coating, after which baking is performed, evaporating the organic binder compound, while for the low-transmissivity film a Cr film may be used.

For the material of the metal film in the present invention, one may use a metal such as chromium (Cr), molybdenum (Mo), tungsten (W), tantalum (Ta), or titanium (Ti), or an alloy having such metals as their main components, or an oxide, nitride, or carbide, etc., of such metals. However, it is desirable that this material have etching characteristics that differ from those of the halftone material film described earlier.

Alternatively, as in the fifth invention, by imparting in addition a light-blocking function to the metal, the effects noted below are added to those noted above (i.e. the effect of preventing damage to the halftone material film by excessive overheating, and the effect of preventing residual metal from the metal film on the halftone material film inside the pattern formation region thereof). That is, with respect to the metal film having the light-blocking function, an effect is realized whereby a degradation in pattern transfer precision due to the passage of unnecessary light through the mask is prevented by making it so that, having passed through a region other than a pattern formation region, exposure light does not pass through the mask due to having the metal film remain on the halftone material film in regions other than the pattern formation region.

For specific film materials in the fifth invention, as in the sixth invention, the halftone material film may be made of a material having molybdenum and silicon as its main components, and the metal film of a material having chromium as its main component.

In order to make the metal film so that the etching rate speeds up as the transparent substrate side is approached from the surface side of the metal film, for example, the materials noted earlier may be combined and laminated, and, in a continuous film (single-layer) or multiple layers, the degree of oxidation, nitrogenization, or carbonization of the materials is changed, either in stages or continuously. Multiple layers can be obtained, for example, by forming films by sputtering in a plurality of chambers. A continuous film (single-layer) may be obtained by forming the film by inline sputtering in the same chamber wherein either a singularity or plurality of targets is provided. On the point of making the pattern cross-section perpendicular, it is preferable that a continuous film (single-layer) be used and that the composition be changed continuously.

Specifically, as in the seventh invention, the configuration of the metal film is made such that a region exists which contains, in the metal film, an element that speeds up the etching rate of the metal film and/or an element that slows down the etching rate thereof, such that the element that speeds up the etching rate increases continuously from the surface side of the metal film progressively toward the transparent substrate side, and/or the element that slows down the etching speed decreases continuously from the surface side of the metal film progressively toward the transparent substrate.

More specifically, when the material used for the halftone material film has as its principle components molybdenum and silicon, the combinations CrN/CrC, CrN/Cr, CrN/CrF, and CrN/CrO may be cited. Moreover, these materials may contain other elements too, to the extent that they do not alter the working effects of the metal films. In continuous film (single-layer) cases, moreover, CrN/CrC refers to a condition wherein C (carbon) decreases and N (nitrogen) increases continuously from the surface side toward the transparent substrate side, without boundary.

Of course, in a multiple layer case, for example, a configuration is also possible wherein the aforesaid metal film is laminated with a film wherein the degree of nitrogenization in the material noted above is varied.

In particular, as in the eighth invention, by making nitrogen the component for speeding up the etching rate and carbon the component for slowing down the etching rate, the crystalline grain in the metal film on the transparent substrate side becomes fine, wherefore the bonding strength with the halftone material film becomes larger and, at the same time, warping of the metal film is prevented, so this is to be preferred.

Furthermore, in cases where film stress is high, as with halftone material films containing molybdenum and silicon, and substrate deformation is induced, by making the metal material constituting the metal film chromium, so as to cancel out that stress, the film stress in the halftone material film is reduced, and substrate deformation is alleviated, making it possible to enhance pattern positioning precision. The material for the halftone material film and the metal constituting the metal film, moreover, can be suitably selected with stress reduction in mind.

The ninth invention is a halftone phase shift mask blank comprising a transparent substrate, a halftone material film formed on the transparent substrate, and a metal film formed on the halftone material film, wherein the halftone material film consists of material containing a metal and silicon, the metal film consists of a material the main component of which is chromium, a component containing nitrogen is contained in the region nearer to the transparent substrate side of the metal film, and a component containing carbon is contained in the region nearer to the surface side of the metal film.

By making the configuration such as this, the crystalline grain becomes fine in the metal film on the transparent substrate side, wherefore the bonding strength with the halftone material film becomes greater, and warping of the metal film is prevented.

Also, the film stress in the halftone material film containing the metal (molybdenum, for example) and silicon can be reduced, and, in conjunction therewith, substrate deformation is alleviated, wherefore pattern positional precision can be enhanced.

The metal film on the surface side becomes a material exhibiting good electrical conductivity, wherefore electrical charges are not accumulated between the metal film and the resist film when patterning the resist film with electron beam exposure. Accordingly, the path of electron beam advance is stabilized, and high precision patterning is made possible.

Sheet resistance is one of the evaluation methods used for determining how good or poor electrical conductivity is, and it is desirable that the value of the sheet resistance of either the uppermost layer or surface layer of the metal film be 1 M$\Omega$/□ or less, and preferable that it be 0.5 M$\Omega$/□.

In view of the fact that, in general, metal materials containing nitrogen have a faster etching rate than metal materials containing carbon, as based on the configuration described in the foregoing, the etching rate varies, becoming faster, in stages and/or continuously, from the surface side of the metal film toward the transparent substrate side thereof.

As a result, a halftone phase shift mask blank is obtained which has no pattern flaws, residual metal having been removed, without damaging the halftone material film.

More specifically, when the halftone material film has as its main components molybdenum and silicon, and the metal film has a plurality of layers, CrN/CrC may be cited for the first metal film/second metal film.

Furthermore, the configuration may also be such that CrN having a different degree of nitrogenization is laminated as the first metal film and CrC having a different degree of carbonization is laminated as the second metal film.

As in the tenth invention, moreover, the nitrogen content on the transparent substrate side of the metal film should be 5 to 60 at %. When that content is less than 5 at %, the crystalline grain does not become fine, the bonding strength with the transparent substrate is weak, stress (warping) occurs readily, and the danger of peeling is heightened.

When, on the other hand, the nitrogen content exceeds 60 at %, the etching rate becomes too fast, the difference in etching rate with the material containing carbon becomes large, and the pattern formation results in an overhanging condition, so that a perpendicular pattern is not obtained, which is undesirable. In this case, when an overhanging condition develops, the ends (edges) of the metal film are easily chipped. When the ends (edges) of the metal film become chipped, this chipped metal film adheres to undesirable places, whereupon black flaws occur. When pattern shape and productivity are considered, the desirable range of nitrogen content is 10 to 40 at %, with a range of 15 to 30 at % being preferred.

In order to obtain a perpendicular pattern, it is desirable to make the carbon content on the surface side of the metal film 4 to 18 at %, as in the 11th invention.

The 12th invention is made such that a region exists wherein the nitrogen content increases continuously, and/or the carbon content decreases continuously, from the surface side of the metal film toward the transparent substrate side. (More specifically, the composition of the metal film is made so that it changes continuously.) Based on this configuration, as compared to when the metal film is made a plurality of layers, there is no adherence of particles, etc., between the layers, wherefore there are no flaws such as half pin holes; the cross-section becomes perpendicular and bonding performance is enhanced, which is to be desired.

When the 13th invention is implemented, by forming an anti-reflection film on the metal film, when making an image, multiple reflection at the metal film surface is prevented, so that high-precision transfers can be made.

Such anti-reflection films include metal films containing oxygen, metal films containing oxygen and nitrogen, and metal films containing fluorine, such as, in terms of specific examples, CrON, CrO, and CrF. Preferably, the main component in these should be the metal that constitutes the metal film in the present invention. That is so because then it is possible to use the same type of etching agent when patterning. Even more preferably, as in the 14th invention, the material of the anti-reflection film noted above should be a material that contains a metal that is a main component in the metal film in the present invention plus at least oxygen. Furthermore, when the anti-reflection film includes a metal (such as chromium), oxygen, and nitrogen, a range of 2 to 60 at % is preferable for the oxygen content, and a range of 10 to 35 at % is preferable for the nitrogen content.

Furthermore, by configuring the metal film and the anti-reflection film as continuous films, wherein the composition changes continuously, as in the 15th invention, there will be no adherence of particles, etc., between the metal film and the anti-reflection film, wherefore there will be no flaws such as half pin holes, the cross-section will become perpendicular, and bonding performance will be enhanced, which is to be desired.

The 16th invention is a halftone phase shift mask having a halftone material film in which a mask pattern has been formed, wherein the mask pattern formed in the halftone material film is formed by subjecting the halftone material film and the halftone phase shift mask blank in the present invention described in the foregoing to mask pattern formation processing. That being so, halftone phase shift masks are obtained which are patterned with high precision and exhibit no pattern flaws.

The 17th invention is characterized in that the metal film of the present invention is formed either in a region not in a region on the halftone material film where a mask pattern is formed, or in a region where a mask pattern is formed. A region other than a region where the mask pattern is formed, that is, a peripheral region or the like, removed from the region where the mask pattern is formed, is a region that does not contribute to pattern transfer exposure. Accordingly, when exposure light passes through this region, there is a danger that it will disturb the pattern exposure, wherefore it is desirable that this region be made so that light does not pass through it. This invention achieves this effect by forming the metal film in this region and thus blocking the light. When we are inside the region wherein the mask pattern is formed, on the other hand, in terms of the function conventionally demanded in the translucent portion in the mask pattern, it is only necessary that it pass light which has its phase shifted only at the boundary with the light transmitting portion, while it is preferable that the other larger part (part excluding the edges) completely block the light. Thereupon, in the invention described above, by forming the metal film in a portion excluding the edges of the translucent portion of the mask pattern, it is possible to make the blocking of light more complete in the portion where the blocking of light should be complete.

The 18th invention is a method of forming fine patterns on semiconductor wafers and the like using a halftone phase shift mask of the present invention. Therewith it is possible to transfer accurate patterns, wherefore it is possible to form good fine patterns.

BRIEF DESCRIPTION OF THE DRAWINGS

FIG. 6 is a table indicating the results of measuring the etching rate in a first metal film 12, the difference in etching rate between the first metal film 12 and second metal film 13, the undercut amounts, and the phase shift amounts, in embodiments 2 to 7 of the present invention and in comparative examples 2 and 3;

FIG. 12 11 is a conceptual cross-sectional diagram representing another example of a conventional method of manufacturing a halftone phase shift mask.

DESCRIPTION OF THE PREFERRED EMBODIMENTS

The present invention is now described in greater detail with reference to embodiments.

A first embodiment is described first.

Figure 1:
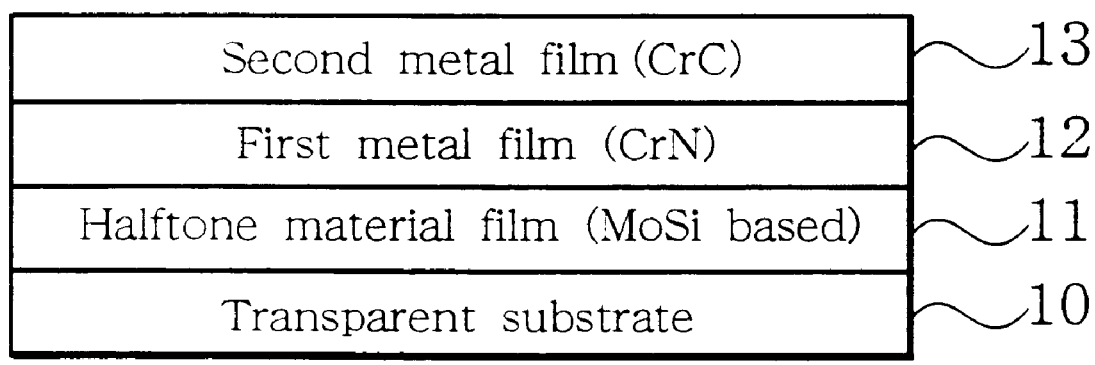
FIG. 1 is a conceptual cross-sectional diagram representing the configuration of a halftone phase shift mask blank in a first embodiment of the present invention.
Figure 2:
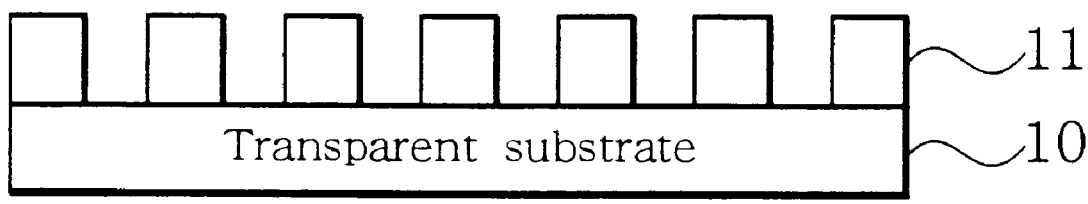
FIG. 2 is a conceptual cross-sectional diagram representing the configuration of a halftone phase shift mask in the first embodiment of the present invention.

FIG. 1 is a conceptual cross-sectional diagram representing the configuration of a halftone phase shift mask blank in the first embodiment; FIG. 2 is a conceptual cross-sectional diagram representing the configuration of a halftone phase shift mask therein; and FIG. 3 and FIG. 4 are conceptual cross-sectional diagrams for describing the method of manufacturing the halftone phase shift mask blank.

The halftone phase shift mask blank in this embodiment is configured with a halftone material film 11 made of a MoSiN-based material, a first metal film 12 made of CrN, and a second metal film 13 made of CrC, laminated in order on a transparent substrate 10 made of quartz.

To describe this in greater detail, the main surfaces and side surfaces of a quartz substrate were precision-polished to produce a transparent substrate 10 that was 6 inches by 6 inches, and 0.25 inch in thickness. Then, using a molybdenum (Mo) and silicon (Si) mixed target (Mo:Si=20:80 mol %), an MoSiN halftone material film 11 having a film thickness of 925 Angstroms was formed on the transparent substrate 10 by reactive sputtering, in an argon (Ar) and nitrogen ($N_2$) mixed gas atmosphere (Ar=20%, $N_2$=90%, pressure=$1.5 \times 10^{-3}$ torr), as diagrammed in FIG. 6(a). For the transparent substrate 10 here, besides quartz, fluorspar and various kinds of glass (such as soda-lime glass, alumino-silicate glass, and alumino-borosilicate glass) are used.

When the composition and optical characteristics of the halftone material film 12 obtained in this manner were measured, the following results were obtained.

Composition: Mo=13 at %, Si=40 at %, N=47 at %

Refractive index: 2.34

Transmissivity for light having wavelength of 248 nm: 5%

Phase shift amount: 180°

Figure 3A:
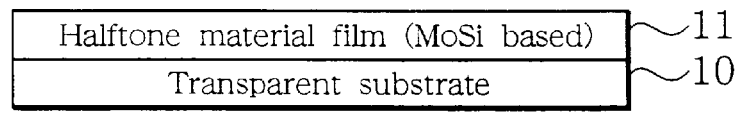
FIG. 3 is a conceptual cross-sectional diagram for explaining the method of manufacturing halftone phase shift mask blanks in the first embodiment of the present invention.
Figure 3B:
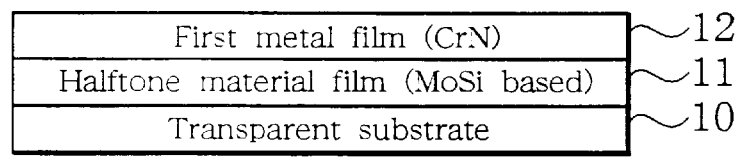

Next, a first metal film 12 of CrN having a film thickness of 150 Angstroms was formed on the halftone material film 11, using a chromium (Cr) target, by reactive sputtering, in an argon (Ar) and nitrogen ($N_2$) mixed gas atmosphere (Ar=80%, $N_2$=20%, pressure=$1.5 \times 10^{-3}$ torr), as diagrammed in FIG. 3(b).

The nitrogen (N) content in the first metal film 12 obtained was 20 at %, and the etching rate thereof was measured at 2.2 nm/sec.

Figure 3C:
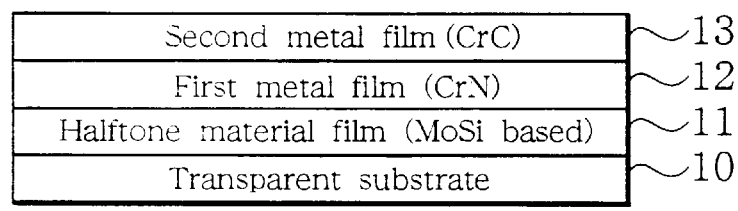

Next, a second metal film 13 of CrC having a film thickness of 600 Angstroms was formed on the first metal film 12, using a chromium target, by reactive sputtering, in an argon (Ar) and methane ($CH_4$) mixed gas atmosphere (Ar=88%, $CH_4$=12%, pressure=$1.5 \times 10^{-3}$ torr), as diagrammed in FIG. 3(c). This was subjected to ultrasonic cleaning to yield a halftone phase shift mask blank.

When the carbon content of the second metal film 13 was measured it was found to be 6 at %. The etching rate was found to be 0.3 nm/sec, and, in terms of optical characteristics, the optical density at a wavelength of 450 nm was 3.0.

When scratch tests were conducted with a load of 600 g, no peeling occurred between the halftone material film 11, first metal film 12, and second metal film 13, and good film strength was obtained.

Figure 3D:
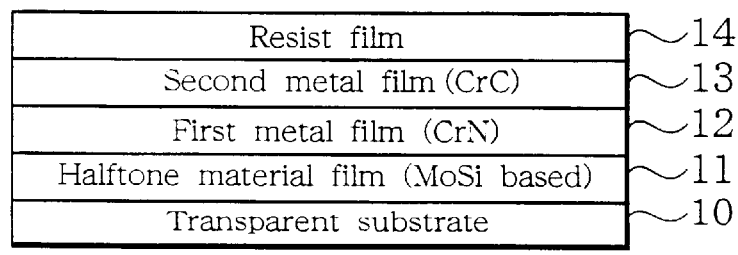
Figure 4A:
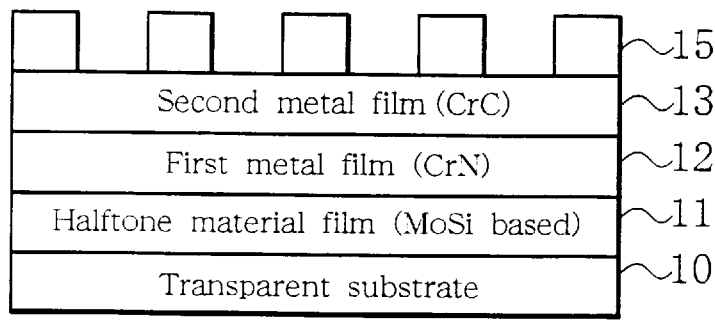
FIG. 4 is a conceptual cross-sectional diagram for explaining the method of manufacturing halftone phase shift mask blanks in the first embodiment of the present invention.
Figure 4B:
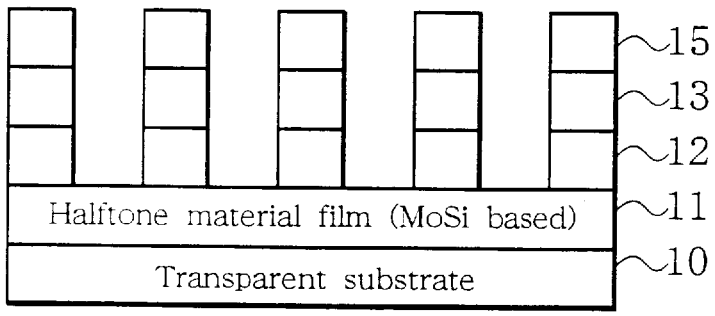

Next, a resist film 14 was formed on the second metal film 13, as diagrammed in FIG. 3(d), and a resist pattern 15 was formed, as diagrammed in FIG. 4(a), by means of pattern exposure and development.

When performing such patterning, stable, high-precision patterning was implemented. However, when the sheet resistance of the second metal film 13 obtained was measured, it was found to be below 0.5 MΩ/□. Consequently, good electrical conductivity was obtained, which is believed to be due to the fact that, when performing electron beam exposure, described earlier, no charge buildup occurred between the second metal film 13 and the resist film 14.

After the patterning described in the foregoing, an etching fluid was prepared by adding pure water to 165 g of cerium ammonium nitrite and 42 ml of 70% chlorine peroxide to make up 1000 ml of liquid, maintained at 19 to 20° C. Using this etching fluid, wet etching was performed, patterning the second metal film 13 and the first metal film 12 as diagrammed in FIG. 4(b).

After performing such patterning, there was no residual metal (Cr) transferred to the halftone material film 11 from the first metal film 12 or second metal film 13, and no damage was observed in the halftone material film 11.

It is conjectured that these results are obtained because, firstly, it is possible to etch the first metal film 12 and second metal film 13, and the halftone material film 11 with mutual selectivity, that is, because the etching characteristics differ between the first metal film 12 and second metal film 13, on the one hand, and the halftone material film 11, on the other, and because, secondly, while the etching rate for the first metal film 12 contacting the halftone material film 11 is of course faster than for the halftone material film 11, it is also faster than a simple Cr body, as will be described below.

Figure 5:
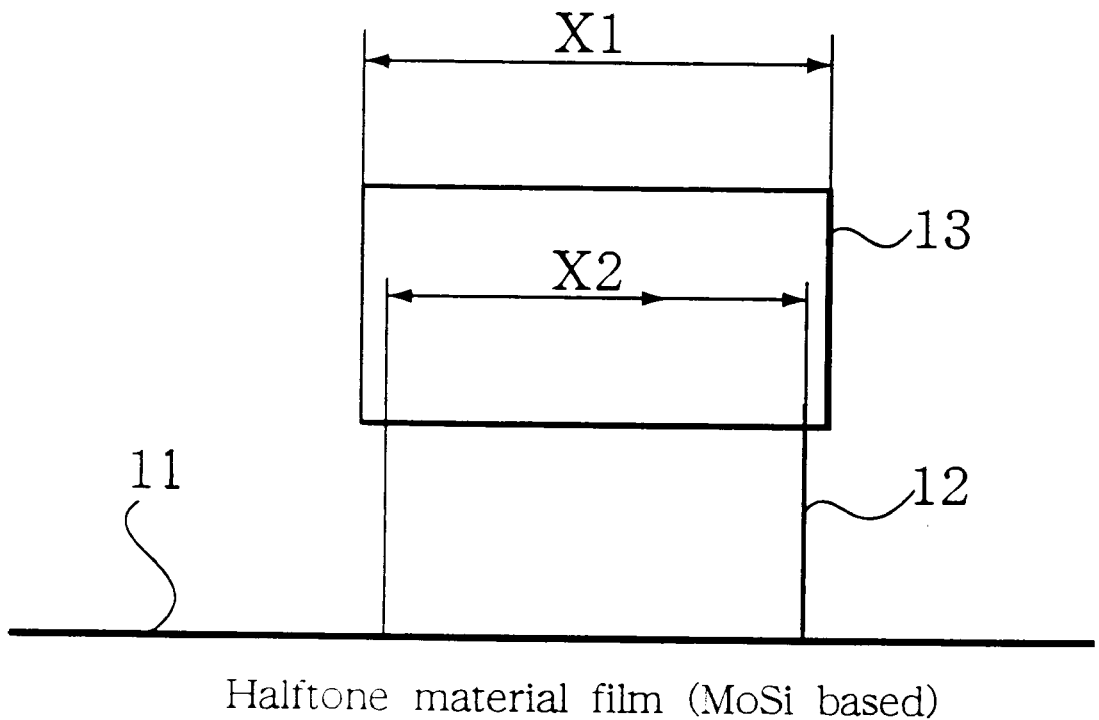
FIG. 5 is a conceptual cross-sectional diagram for explaining the method of manufacturing halftone phase shift masks in the first embodiment of the present invention.

As diagrammed in FIG. 5, moreover, the difference in the post-etching width dimensions $X_2$ and $X_1$ of the first metal film 12 and second metal film 13, respectively, which is to say the undercut amount, was $0.02\mu$, which is extremely small, wherefore the overhang shape does not become pronounced enough for the tip to be broken, and perpendicular patterns are obtained.

This is believed to be due to the fact that the difference in etching rate between the first metal film 12 and second metal film 13 is small, namely 1.9 nm/sec.

Figure 4C:
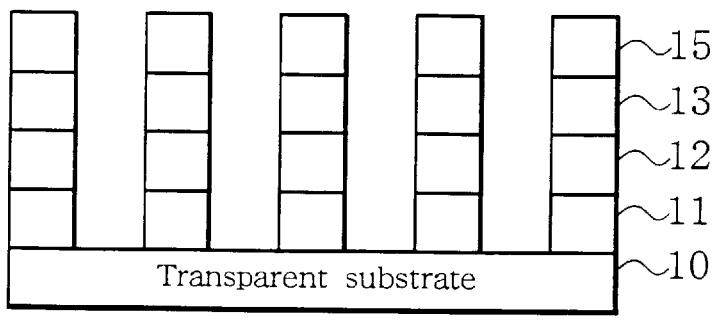
Figure 4D:
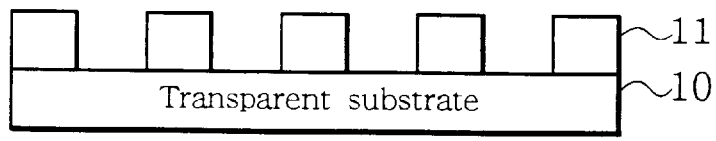

Next, using the patterns in the first and second metal films 12 and 13 as masks, dry etching was performed with a gas mixture of $CF_4$ and $O_2$ to remove the exposed portion of the halftone material film 11 and form the halftone material film pattern 11, as diagrammed in FIG. 4(c).

Thus, the resist pattern 15 noted earlier was peeled away by sulfuric acid, and an etching fluid was prepared by adding pure water to 165 g of cerium ammonium nitrite and 42 ml of 70% chlorine peroxide to make up 1000 ml of liquid, which was maintained at 19 to 20° C. Using this etching fluid, wet etching was performed, the second metal film 13 and the first metal film 12 were removed, and a halftone phase shift mask was obtained which was provided with a halftone material film pattern 11 in the pattern desired, as diagrammed in FIG. 4(d).

A comparative example is described next.

For purposes of comparison, a halftone phase shift mask blank and halftone phase shift mask were fabricated as in the first embodiment, excepting that a first metal film made of Cr and having a film thickness of 300 Angstroms and a second metal film made of CrN and having a film thickness of 150 Angstroms were formed on the halftone material film 11 of the first embodiment.

Here, the first metal film was fabricated by sputtering in an Ar gas atmosphere at $1.5 \times 10^{-3}$ torr, while the second metal film was fabricated by reactive sputtering in an Ar and $N_2$ mixed gas atmosphere (Ar=80%, $N_2$=20%) at $1.5 \times 10^{-3}$ torr.

In this comparative example 1, damage occurred in the surface of the halftone material film, for which reason a difficulty developed in that the desired phase difference was not obtained.

The explanation for this is thought to be that the etching rates for the Cr film and CrN film are 1.5 nm/sec and 2.2 nm/sec, respectively, whereupon, when performing the patterning, the etching rate for the first metal film made of Cr and contacting the halftone material film is slower than that for the second metal film made of CrN formed on the first metal film.

When scratch tests were performed on the halftone phase shift mask blanks obtained, peeling occurred between the first metal film and second metal film, and bonding strength was inadequate, in 8 out of 100 test pieces.

Embodiments 2 to 7 and comparative examples 2 and 3 are now described.

For the purpose of further comparison, when forming the first metal film 12, the quantity of $N_2$ contained in the gas mixture of Ar and $N_2$ was adjusted, varying the nitrogen content in the first metal film 12 between 5 at % (second embodiment), 10 at % (third embodiment), 30 at % (fourth embodiment), 40 at % (fifth embodiment), 50 at % (sixth embodiment), and 60 at % (seventh embodiment), while keeping the other conditions the same as in the embodiment described in the foregoing. Thus each embodiment was fabricated so that the phase shift amount became 180°. Second and third comparative examples were also fabricated, having nitrogen contents of 3 at % and 65 at %, respectively. Measurements were then made of etching rates (in nm/sec) for the first metal film, differences in etching rate (in nm/sec) between the first metal film 12 and second metal film 13, undercut amount ($\mu$), and phase shift (°), in these embodiments and comparative examples. The results are given in the table in FIG. 6.

As is evident from this table, when the nitrogen content in the first metal film 12 is 5 to 10 at %, the undercut becomes less than 0.1 $\mu$, wherefore black flaws resulting from chips in the tips of the metal film due to overhang are suppressed. In addition, a nearly perpendicular pattern is formed, and high-precision patterning is performed.

The etching rate of the metal film 12 contacting the halftone material film 11 is sufficiently fast, moreover, so there will seldom be any damage done to the halftone material film 11, and the amount of phase shift will be confined within a range of 180°–2°, yielding highly reliable halftone phase shift masks.

In both of the comparative examples 2 and 3, however, wherein the nitrogen content in the first metal film 12 is outside the range noted, not only does an overhanging shape develop, so that black faults readily occur, but perpendicular patterning cannot be effected, and high-precision patterning cannot be achieved.

An eighth embodiment is now described.

A halftone phase shift mask blank and halftone phase shift mask were fabricated in the same way as in the first embodiment, except in that an anti-oxidization film made of CrON and having a film thickness of 250 Angstroms was formed on the halftone phase shift mask blank obtained in the first embodiment. In terms of the optical characteristics of the halftone phase shift mask blank so obtained, the surface reflectance at a wavelength of 365 nm was 20% or lower, which is good.

The anti-oxidation film here was fabricated by reactive sputtering in an argon (Ar) and nitrous oxide ($N_2O$) mixed gas atmosphere (Ar=80%, $N_2O$=20%), at $1.5\times10^{-3}$.

The halftone phase shift mask blank thus obtained exhibited outstanding characteristics, including low surface reflectance in addition to the beneficial effects gained in the first embodiment.

Using the halftone phase shift mask blank described above, the anti-reflection film, metal films (first metal film and second metal film), and halftone material film were subjected to patterning to yield a halftone phase shift mask.

A ninth embodiment is now described.

Figure 7:
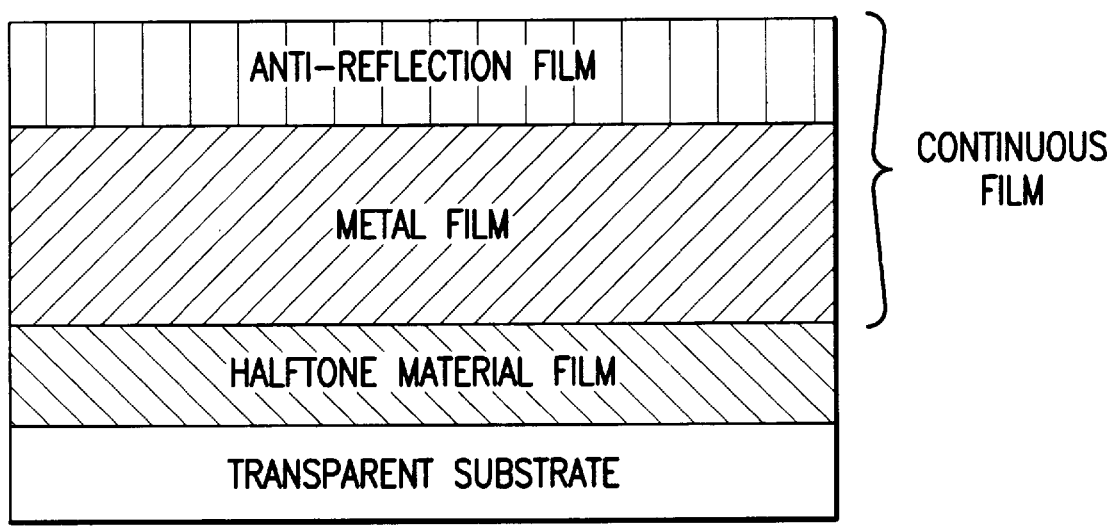
FIG. 7 is a conceptual cross-sectional diagram representing the configuration of a halftone phase shift mask blank in a ninth embodiment of the present invention.
Figure 8:
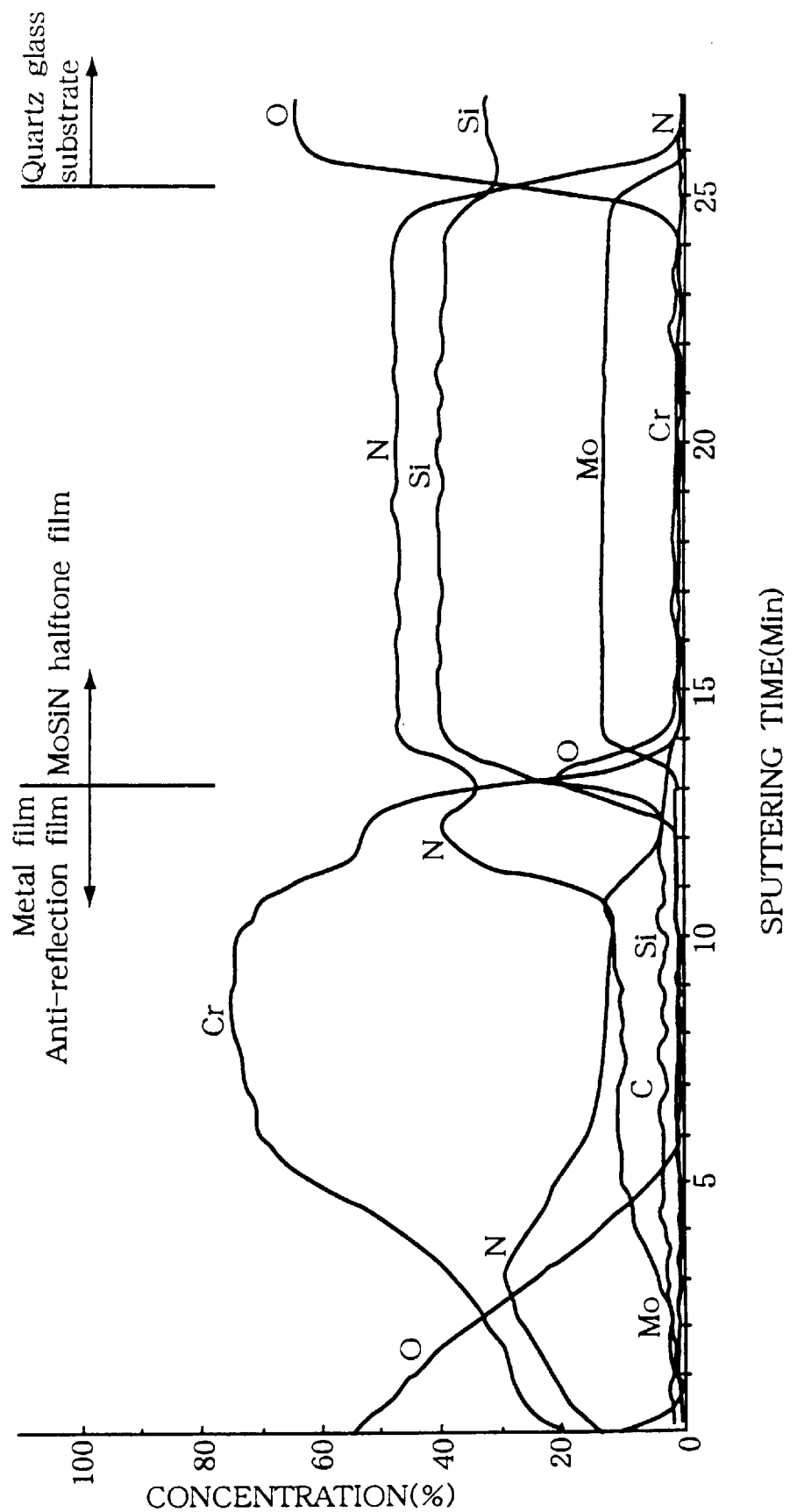
FIG. 8 is a diagram indicating the results of Auger analysis on the halftone phase shift mask blank in the ninth embodiment of the present invention.

A halftone phase shift mask blank pertaining to another embodiment of the present invention is diagrammed in FIG. 7. The halftone phase shift mask blank in this embodiment is configured with a halftone material film made of an MoSi-based material, metal film, and an anti-reflection film, laminated successively on a transparent substrate made of quartz. The metal film and anti-reflection film in this embodiment are made by continuously forming, as noted in the eighth embodiment, a first metal film of CrN, a second metal film of CrC, and an anti-reflection film of CrON, by in-line sputtering. When the compositions of these metal films and anti-reflection films were analyzed by Auger spectroscopy, the results for CrN were Cr=48–72 at %, N=13–41 at %, O=0–10 at %, and C=3–13 at %, the results for CrC were Cr=61–76 at %, C=6–14 at %, N=13–23 at %, and O=0–8 at %, and the results for CrON were Cr=17–60 at %, O=8–55 at %, N=15–30 at %, and C=1–10 at %. The quantities of the elements Cr, N, O, and C contained in the metal films and anti-reflection films, moreover, vary continuously in the direction of film thickness. In FIG. 8 are plotted the results of investigating by Auger spectroscopy the quantities of elements contained in each of the films in the ninth embodiment.

When this halftone phase shift mask blank was subjected to scratch tests (on 100 pieces) under a load of 600 g, good film strength was obtained, with no film peeling between the halftone material film and the CrN first metal film, between the CrN first metal film and the CrC second metal film, or between the CrC second metal film and the CrON anti-reflection film. The explanation for this is that, because of the reduction in stress due to the fineness of the crystalline grain in CrN film on the transparent substrate side of the metal film contacting the halftone material film, and to forming a continuous film between the CrC and the CrN in the metal film, and between the CrC and the CrON anti-reflection film, wherein a region exists where the composition changes continuously, wherefore particles etc. do not adhere between the layers, and exposure to the atmosphere is internal, so that continuous films are formed without oxidation at the surface.

As in the other embodiments described in the foregoing, the anti-reflection film, metal films (first metal film and second metal film), and halftone material film were subjected to patterning to yield a halftone phase shift mask.

In this case, the metal film and anti-reflection film are formed integrally as a continuous layer in the thickness direction (that is, a region exists wherein the elements making up the CrN and CrC that are the metal films and the CrON that is the anti-reflection film vary continuously), wherefore the same benefits as obtained in the first and eighth embodiments described in the foregoing (i.e. good film strength, halftone material film damage prevention and overhang prevention during patterning, and low surface reflectance) are realized. In particular, however, a perpendicular cross-section is formed from the transparent substrate side toward the surface side (the anti-reflection film side), without any steps, thus making it possible to effect high-precision patterning on the halftone material film.

A tenth embodiment is now described.

A halftone phase shift mask blank according to this embodiment was fabricated as described below.

On a transistor substrate made of quartz is formed a low-transmissivity film made of Cr by a sputtering method. Onto this low-transmissivity film is dripped an $SiO_2$-based coating film forming coating liquid, which is spread over the entire surface by spin coating. This is then baked to evaporate the organic binder compound, a high transmissivity film made of an SOG (spin on glass) film is formed, and a half-tone material film is fashioned from the low-transmissivity film and the high-transmissivity film.

Thereafter, using the same sputtering method as in the eighth embodiment, a CrN first metal film, CrC second metal film, and CrON anti-reflection film are formed to yield a halftone phase shift mask blank.

As in the other embodiments described in the foregoing, the anti-reflection film, metal films (first metal film and second metal film), and halftone material film were subjected to patterning to yield a halftone phase shift mask.

The halftone phase shift masks in the eighth, ninth, and tenth embodiment described in the foregoing exhibit a sufficiently fast etching rate for the metal film in contact with the halftone material film, wherefore the halftone material film is rarely damaged and the amount of phase shift is contained within the range of 180°–2°, whereupon a highly reliable halftone phase shift mask is obtained.

It should be noted that the configurations and dimensions, etc., indicated in the embodiments described above are examples thereof. Various modifications are possible according to design needs.

In the foregoing embodiments, for example, a halftone phase shift mask is indicated in which the metal films 12 and 13 formed on the halftone material film 11 are completely removed, but [the invention] is not limited by this. It is possible to provide patterns with the first metal film and the second metal film formed at suitable locations on the halftone material film, or metal films whereon, in addition, a anti-reflection film is formed, and thus enhance the mask light blocking performance. Typical examples of this halftone phase shift mask are diagrammed in FIG. 9 and 10.

Figure 9:
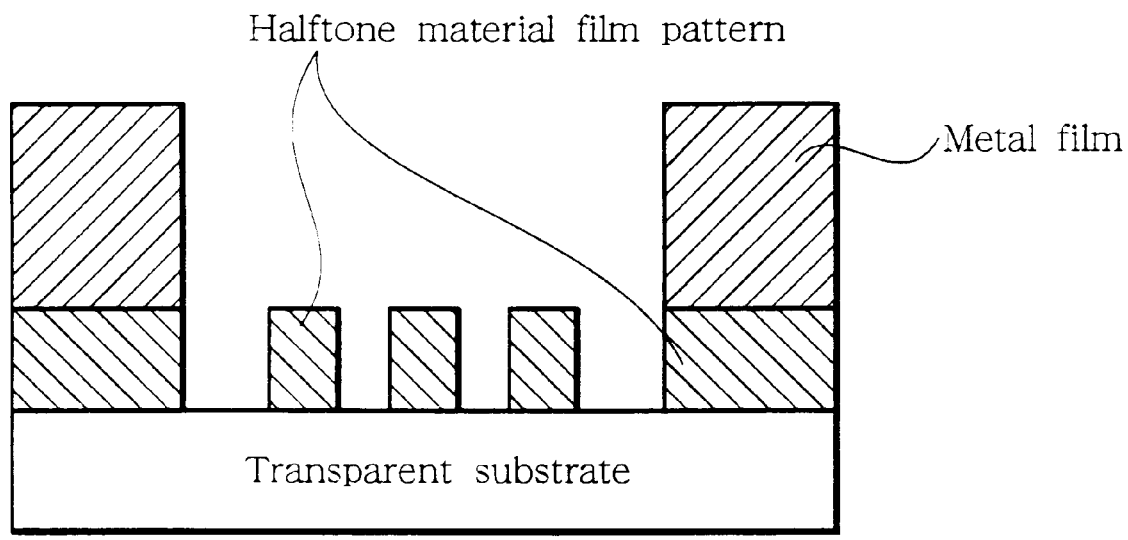
FIG. 9 is a diagram representing the configuration of a halftone phase shift mask in another embodiment of the present invention.

In the example diagrammed in FIG. 9, the metal film (with anti-reflection film) is formed on the halftone material film in a peripheral region that is a region removed from the mask pattern formation region. This metal film provides the function of blocking light. That is, the exposure light is prevented from passing through this peripheral region.

The reason for this is as follows. Ordinarily, a phase shift mask is used as a mask (reticle) in a reductive projection exposure apparatus (stepper). When a pattern is being transferred using such a stepper, exposure is performed, covering the peripheral area so that only the phase shift mask transfer region is exposed by a coated member (aperture) provided in the stepper. However, it is very difficult to position this aperture with good precision so that only the transfer region is exposed. In many cases, the exposed portion protrudes into the non-transfer region about the periphery of the transfer region. This being so, a light-translucent film is usually formed, in the non-transfer region on the mask, which only passes light of such intensity as does not significantly contribute to exposure, so that problems are not caused by the protruding described. However, exposures are done while repeatedly stepping, wherefore cases occur wherein this portion exposed by the protrusion (protrusion exposure portion) overlaps the transfer region, or wherein overlapping occurs, similarly, with protrusion-exposed portions during other shots. Cases arise where, due to such overlapping exposures, these accumulate until quantities are attained that do contribute to exposure. By making the peripheral region such that exposure light is completely prevented from passing through, as described in the foregoing, the danger of such flaws developing can be eliminated.

Figure 10:
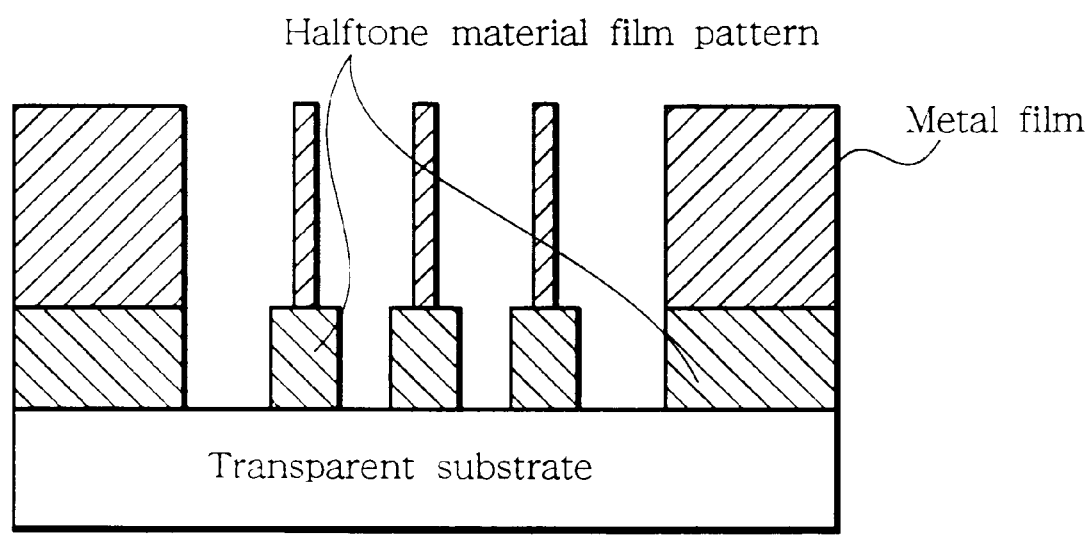
FIG. 10 is a diagram representing the configuration of a halftone phase shift mask in another embodiment of the present invention.
Figure 11A:
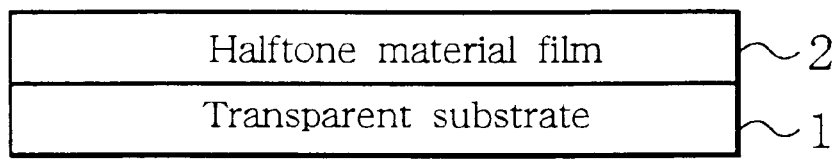
FIG. 11 is a conceptual cross-sectional diagram representing one example of a conventional method of manufacturing a halftone phase shift mask.
Figure 11B:
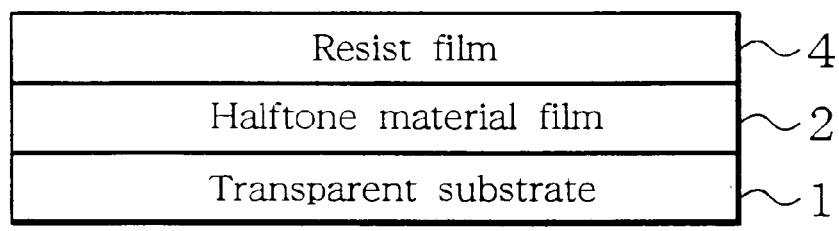
Figure 11C:
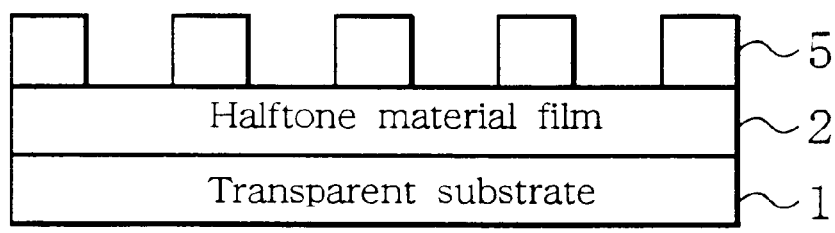
Figure 12A:
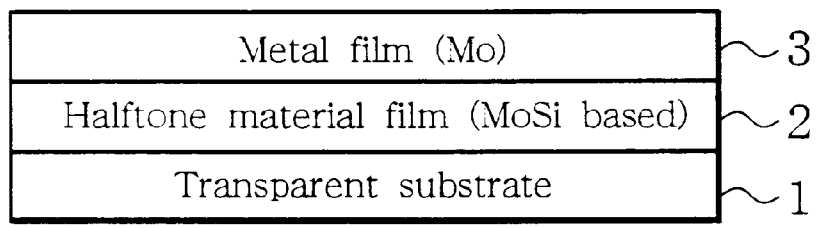
Figure 12B:
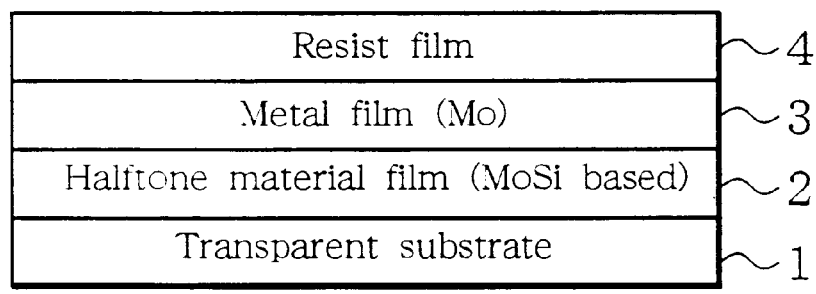
Figure 12C:
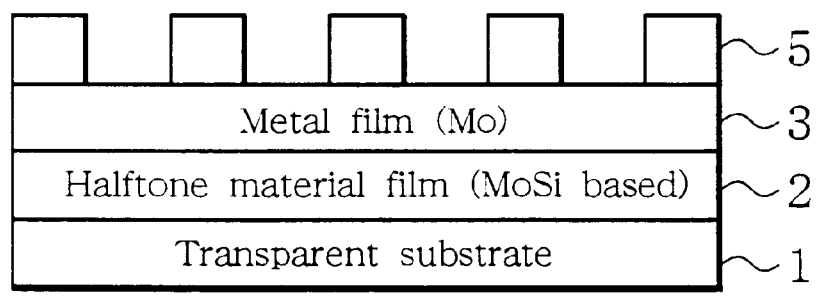
Figure 13A:
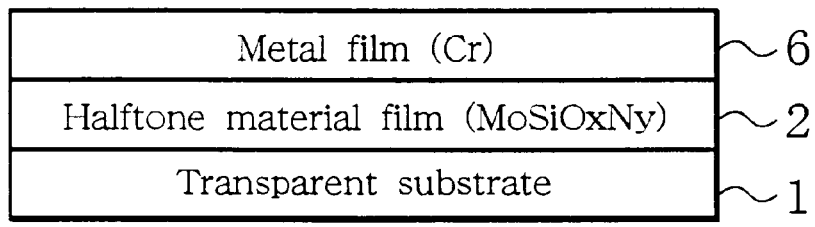
FIG. 13 is a conceptual cross-sectional diagram representing yet another example of a conventional method of manufacturing a halftone phase shift mask.
Figure 13B:
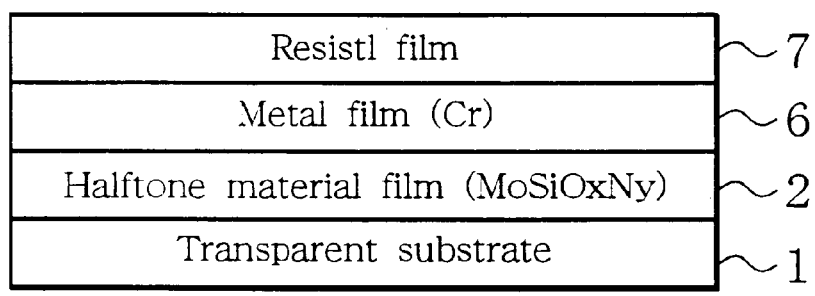
Figure 13C:
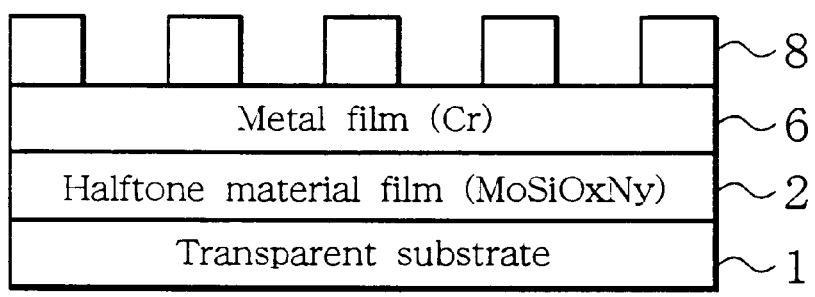

In the example diagrammed in FIG. 10, by forming the metal film in a portion excluding the edges of the translucent portion of the mask pattern, inside the region where the mask pattern is formed, it is possible to make the blocking of light more complete in the portion where the blocking of light should be complete. In other words, inside the region where the mask pattern is formed, the function conventionally required of the translucent portion in the mask pattern need only cause light to pass the phase of which has been shifted only at the boundary with the transparent portion, while it is desirable that the other larger part (part excluding the edges) completely block the light. Thereupon, by forming the metal film in the portion excluding the edges of the surface of the translucent portion of the mask pattern, it becomes possible to make the blocking of light more complete in the portion where the blocking of light should be complete. Furthermore, in a case where, for example, there is a step or steps in the surface of the transfer medium, so that the film thickness of the resist formed on the transfer medium differs greatly depending on the location, if there is a slight exposure through a translucent portion (portion that should block light) of the halftone material film where the resist film thickness is thin, that thin resist will be made even thinner by development. When that happens, during etching, so-called film erosion occurs. This film erosion can be prevented by making the portions that should block light be completely light-blocking.

It is preferable that an anti-reflection film be provided for these metal films.

The anti-reflection film described earlier was formed in an Ar and $N_2O$ mixed gas atmosphere, but this is not a limitation, and the atmosphere may be Ar and $N_2+O_2$ or NO, etc.

By implementing the present invention, as described in the foregoing, halftone phase shift mask blanks and halftone phase shift masks can be obtained which permit high-precision patterning, which exhibit high resistance to acids, and which are highly reliable.

What is claimed is:

1. A halftone phase shift mask blank comprising:
   a transparent substrate;
   a halftone material film laminated on said transparent substrate; and
   a metal film laminated on said halftone material film; wherein:
   said metal film is configured with materials having differing etching rates, as the etching proceeds from the surface side toward the transparent substrate side, either in stages, or continuously, or partly in stages and partly continuously; and
   said etching rate is set so as to become faster, as said transparent substrate side is approached from said surface side, either in stages, or continuously, or partly in stages and partly continuously.

2. The halftone phase shift mask blank according to claim 1, wherein said metal film is employed as a mask when forming a pattern on said halftone material film by photolithography.

3. The halftone phase shift mask blank according to claim 2, wherein said metal film comprises materials having etching characteristics different from those of said halftone material film.

4. The halftone phase shift mask blank according to claim 3, wherein said metal film comprises materials having a faster etching rate than said halftone material film.

5. The halftone phase shift mask blank according to claim 2, wherein said metal film comprises materials exhibiting a light-blocking function.

6. The halftone phase shift mask blank according to claim 5, wherein said halftone material film has molybdenum and silicon as its main constituent elements, and said metal film has chromium as its main constituent element.

7. The halftone phase shift mask blank according to claim 1, wherein: said metal film comprises a plurality of components that includes one or more components in addition to metal constituting main component thereof; a component other than said metal among said plurality of components either is a component that speeds up etching rate of said metal film, as compared to etching rate of a film comprising only said metal, or is a component that slows down said rate, or is a plurality of components that includes a component that speeds up said rate and a component that slows down said rate; said component speeding up said etching rate is contained in said metal film so that a region exists wherein amount of said component contained increases continuously as said transparent substrate side is approached from said surface side of said metal film; and said component slowing down said etching rate is contained in said metal film so that a region exists wherein amount of said component contained decreases continuously as said transparent substrate side is approached from said surface side of said metal film.

8. The halftone phase shift mask blank according to claim 7, wherein: said component speeding up said etching rate is a component containing nitrogen, and said component slowing down said etching rate is a component containing carbon.

9. The halftone phase shift mask blank according to claim 1, wherein an anti-reflection film is provided on said metal film.

10. The halftone phase shift mask blank according to claim 9, wherein said anti-reflection film contains the metal configuring said metal film and at least oxygen.

11. The halftone phase shift mask blank according to claim 10, wherein said metal film and said anti-reflection film are formed integrally as a layer that is continuous in the thickness direction.

12. A halftone phase shift mask comprising:
    a halftone material film in which is formed a mask pattern wherein:
        said mask pattern formed in said halftone material film is formed by performing mask pattern formation processing on said metal film and said halftone material film of said halftone phase shift mask blank cited in claim 1.

13. The halftone phase shift mask according to claim 12, wherein the metal film cited in claim 1 is formed either in a region that is on said halftone material film in a region other than a region in which a mask pattern is formed, or in a region in which a mask pattern is formed.

14. A fine pattern forming method for forming fine patterns by a photolithographic method, wherein:
    the halftone phase shift mask cited in claim 12 is employed as a mask when transferring said fine patterns.

15. A halftone phase shift mask blank comprising:
    a transparent substrate;
    a halftone material film laminated on said transparent substrate; and
    a metal film laminated on said halftone material film; wherein:
        said halftone material film consists of material containing a metal and silicon;
        said metal film consists of material the main component of which is chromium;
        a component containing nitrogen is contained in region closer to the transparent substrate side of said metal film; and
        a component containing carbon is contained in region closer to the surface side of said metal film.

16. The halftone phase shift mask blank according to claim 15, wherein nitrogen composition ratio in said region containing said component containing nitrogen closer to said transparent substrate side of said metal film is 5 to 60 at %.

17. The halftone phase shift mask blank according to claim 15, wherein carbon composition ratio in said region containing said component containing carbon closer to said surface side of said metal film is 4 to 18 at %.

18. The halftone phase shift mask blank according to claim 15, wherein said metal film has either a region wherein nitrogen content continuously increases, or a region wherein carbon content continually decreases, as said transparent substrate side is approached from said surface side of said metal film, or a region wherein nitrogen content continuously increases while carbon content continuously decreases as said transparent substrate side is approached from said surface side of said metal film.

* * * * *